(12) United States Patent
Ma

(10) Patent No.: US 8,115,528 B2
(45) Date of Patent: *Feb. 14, 2012

(54) METHOD AND APPARATUS FOR OUTPUT DATA SYNCHRONIZATION WITH SYSTEM CLOCK

(75) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/763,941

(22) Filed: Apr. 20, 2010

(65) Prior Publication Data

US 2010/0201415 A1 Aug. 12, 2010

Related U.S. Application Data

(63) Continuation of application No. 11/756,413, filed on May 31, 2007, now Pat. No. 7,701,272.

(51) Int. Cl.
 *H03L 7/06* (2006.01)
(52) U.S. Cl. ......................... 327/158; 327/149
(58) Field of Classification Search .................. 327/149, 327/158
See application file for complete search history.

(56) References Cited

U.S. PATENT DOCUMENTS

| | | | | |
|---|---|---|---|---|
| 5,369,640 A * | 11/1994 | Watson et al. | .............. | 714/700 |
| 6,445,231 B1 * | 9/2002 | Baker et al. | .............. | 327/158 |
| 6,476,653 B1 * | 11/2002 | Matsuzaki | .............. | 327/158 |
| 6,552,587 B2 * | 4/2003 | Kim et al. | .............. | 327/158 |
| 6,774,690 B2 * | 8/2004 | Baker et al. | .............. | 327/158 |
| 6,836,166 B2 * | 12/2004 | Lin et al. | .............. | 327/158 |
| 6,845,458 B2 * | 1/2005 | Lin | .............. | 713/401 |
| 6,956,418 B2 * | 10/2005 | Kwak et al. | .............. | 327/158 |
| 6,963,235 B2 * | 11/2005 | Lee | .............. | 327/158 |
| 6,968,026 B1 | 11/2005 | Li et al. | | |
| 7,098,712 B2 * | 8/2006 | Lee | .............. | 327/161 |
| 7,227,809 B2 * | 6/2007 | Kwak | .............. | 365/189.15 |
| 7,250,798 B2 * | 7/2007 | Deivasigamani et al. | .... | 327/149 |
| 7,277,357 B1 * | 10/2007 | Ma | .............. | 365/233.12 |
| RE40,205 E * | 4/2008 | Funaba et al. | .............. | 365/194 |
| 7,368,964 B2 * | 5/2008 | Kim et al. | .............. | 327/158 |
| 7,397,880 B2 * | 7/2008 | Mitsumoto | .............. | 375/371 |
| 7,400,181 B2 * | 7/2008 | Metz et al. | .............. | 327/149 |
| 7,436,230 B2 * | 10/2008 | Kim | .............. | 327/158 |
| 7,489,587 B2 * | 2/2009 | Bell et al. | .............. | 365/233.12 |
| 7,701,272 B2 * | 4/2010 | Ma | .............. | 327/158 |
| 2002/0008558 A1 * | 1/2002 | Okuda et al. | .............. | 327/175 |
| 2004/0124896 A1 * | 7/2004 | Byun et al. | .............. | 327/158 |
| 2005/0242855 A1 * | 11/2005 | Lee | .............. | 327/158 |
| 2006/0062058 A1 | 3/2006 | Lin | | |
| 2007/0086267 A1 * | 4/2007 | Kwak | .............. | 365/233 |
| 2008/0042702 A1 * | 2/2008 | Ma | .............. | 327/154 |
| 2008/0252343 A1 * | 10/2008 | Yamane | .............. | 327/158 |

* cited by examiner

*Primary Examiner* — Lincoln Donovan
*Assistant Examiner* — Adam Houston
(74) *Attorney, Agent, or Firm* — TraskBritt

(57) ABSTRACT

A circuit, delay-locked loop, memory device, system and method of synchronizing a clock are described. A circuit generally includes a delay line configured to delay an external clock signal to produce a substantially in-phase output clock signal, a main loop configured to control delay through the delay line, and a secondary loop configured to adjust delay through the main loop. The clock synchronization method generally includes adjusting a delay along a delay line in response to a first phase difference between an input clock to the delay line and a shared clock signal delayed by a shared dynamic I/O model of an output driver. The method further includes adjusting the shared dynamic I/O model in response to a second phase difference between an output clock signal and the shared clock signal.

16 Claims, 7 Drawing Sheets

METHOD AND APPARATUS FOR OUTPUT DATA SYNCHRONIZATION WITH SYSTEM CLOCK

CROSS-REFERENCE TO RELATED APPLICATION

This application is a continuation of U.S. patent application Ser No. 11/756,413, filed May 31, 2007, now U.S. Pat. No. 7,701,272 issued on Apr. 20, 2010, the disclosure of which is hereby incorporated herein by this reference in its entirety.

FIELD OF THE INVENTION

Embodiments of the present invention relate generally to memory devices and, more particularly, to memory devices adapted to receive input data and provide output data synchronized with a common external clock signal.

BACKGROUND

Modern high-speed integrated circuit devices, such as synchronous dynamic random access memories (SDRAM), microprocessors, etc., rely upon clock signals to control the flow of commands, data, addresses, etc., into, through, and out of the devices. Additionally, other types of circuit architectures require individual parts to work in unison even though such parts may individually operate at different speeds. As a result, the ability to control the operation of a part through the generation of local clock signals has become increasingly more important. Conventionally, data transfer operations are initiated at the edges of the clock signals (i.e., transitions from high to low or low to high).

In synchronous systems, integrated circuits are synchronized to a common system reference clock. This synchronization often cannot be achieved simply by distributing a single system clock to each of the integrated circuits for the following reason, among others. When an integrated circuit receives a system clock, the circuit often conditions the system clock before the circuit can use the clock. For example, the circuit may buffer the incoming system clock or may convert the incoming system clock from one voltage level to another. This processing introduces its own delay, with the result that the locally processed system clock often will no longer be adequately synchronized with the incoming system clock. The trend toward faster system clock speeds further aggravates this problem since faster clock speeds reduce the amount of delay, or clock skew, which can be tolerated.

To remedy this problem, an additional circuit is conventionally used to synchronize the local clock to the system clock. Two common circuits that are used for this purpose are the phase-locked loop (PLL) and the delay-locked loop (DLL). In the phase-locked loop, a voltage-controlled oscillator produces the local clock. The phases of the local clock and the system clock are compared by a phase-frequency detector, with the resulting error signal used to drive the voltage-controlled oscillator via a loop filter. The feedback via the loop filter phase locks the local clock to the system clock. The delay-locked loop generates a synchronized local clock by delaying the incoming system clock by an integer number of periods. More specifically, the buffers, voltage level converters, etc., of the integrated circuit introduce a certain amount of delay. The delay-locked loop introduces an additional amount of delay such that the resulting local clock is synchronous with the incoming system clock.

In double data rate (DDR) dynamic random access memory (DRAM), wherein operations are initiated on both the rising and the falling edges of the clock signals, it is known to employ a delay lock loop (DDL) to synchronize the output data with the system clock (XCLK) using a phase detector. In an ideal case, the rising edge data is perfectly aligned with the rising edge of the XCLK, the falling edge data is perfectly aligned with the falling edge of the XCLK, and the $t_{AC}$, or time from when a transition occurs on the XCLK to the time when the data comes through the synchronizing data output (DQ), is within specifications. To approximate an ideal system, a phase detector is conventionally used to lock the rising edge of the DQ signal to the rising edge of the XCLK. In the ideal system, as a result of the rising edge of the DQ signal being phase-locked to the rising edge of the XCLK, the falling edge of the DQ signal changes phase at the same time as the XCLK, or at least within an allowed tolerance ($t_{AC}$).

A conventional high speed DLL is known to include one negative feedback loop to provide stability and a reliable locking process. Due to the nature of clock synchronization, the accuracy of the DLL over process-voltage-temperature (PVT) differences is strongly dependent on the resemblance between the replica model of the clock path (e.g., clock input buffer, clock mux, clock distribution tree, pre-driver, output driver, etc.) inside of the feedback loop and the actual clock path outside of the DLL.

Unfortunately, however, not all synchronizing circuitry components are "ideal." Variations in layout, fabrication processes, operating temperatures, and the like, result in non-symmetrical delays among the DLL delay elements. As clock frequency increases, the conventional DLL exhibits an unacceptable tolerance ($t_{AC}$) variance (i.e., loose distribution) over process-voltage-temperature (PVT) differences. This unacceptable variance over increasing clock frequencies is undesirable for high-speed performance.

It is, therefore, desirable to have synchronizing circuitry including a DLL that compensates for, or at least makes predictable, the variations in delay among the DLL delay elements to enable better matching between the XCLK signal and the DQ signal and thus result in more reliable performance at high speeds.

DETAILED DESCRIPTION

The various embodiments discussed herein relate to a high-speed, Delay Locked Loop (DLL) including an adaptive dual-loop DLL design concept, such as for overcoming the shortcomings of the single loop DLL design. Generally, the $t_{AC}$ variance (i.e., delay mismatch) caused by process-voltage-temperature (PVT) differences that affect the main loop can be compensated for by a secondary loop that adjusts a dynamic replica model that is adaptively responsive to PVT variations and changes.

Figure 1:
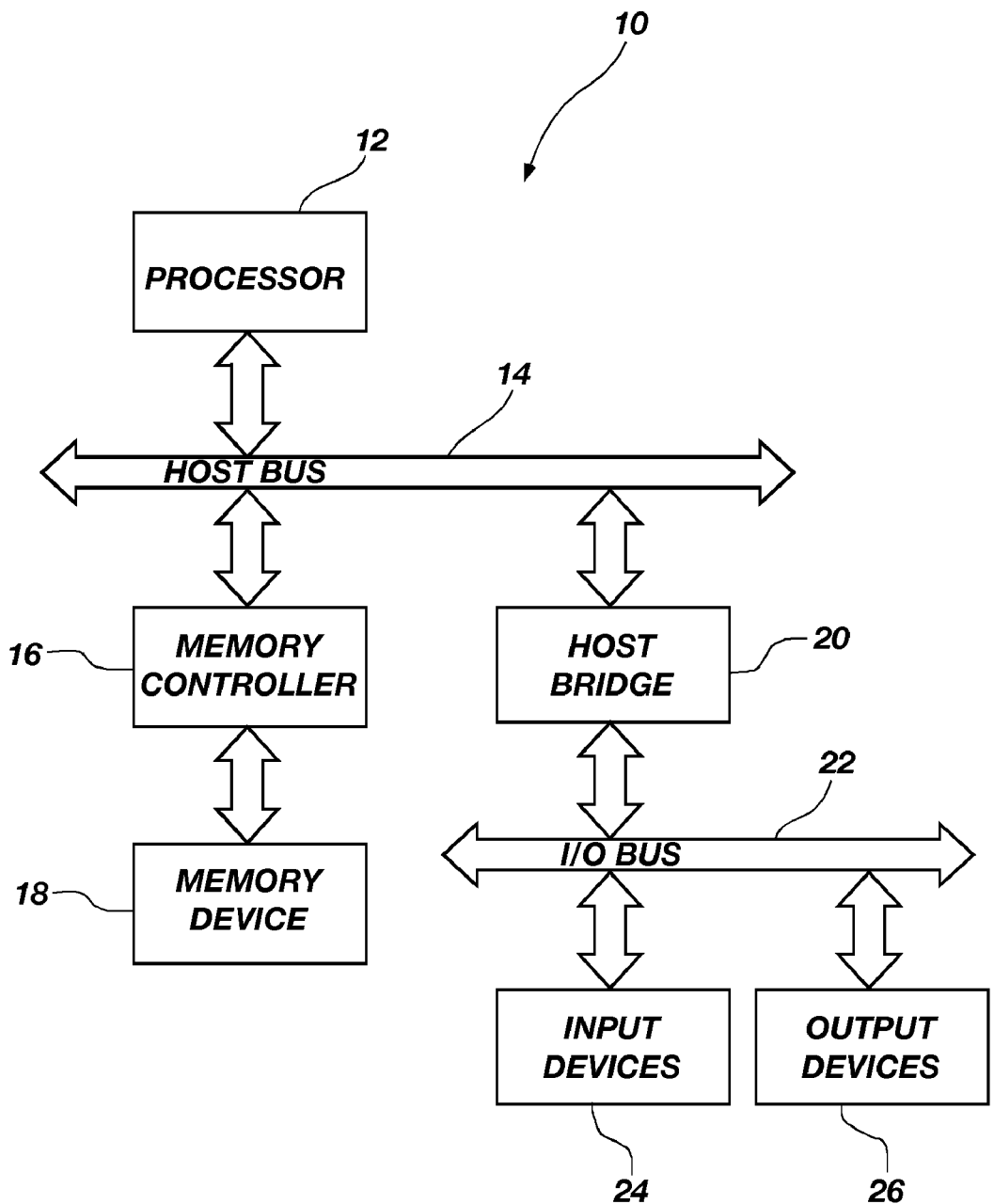
FIG. 1 is a system diagram of an electronic system, in accordance with an embodiment of the present invention.

DLL circuits find application to various electronic circuits and systems, an example of which is a synchronous memory system. In synchronous memory systems, such as in a dynamic random access memory system, the data out latch strobe or clock should be locked or should maintain a fixed relationship to the external clock (XCLK) for high-speed performance. The clock-access and output-hold times are determined by the delay time of the internal circuits. Referring to FIG. 1, a simplified block diagram of an electronic system 10 (e.g., a computer system, cell phone, media player, camera, etc.) is provided. While the present embodiment includes devices or elements for a specific bus architecture, simplified or integrated architectures, which may include only a subset of the devices or elements disclosed herein are also contemplated within the scope of the present invention.

The electronic system 10 may include a processor 12 coupled to a host bus 14. A memory controller 16 may be coupled to both the host bus 14 and a memory device 18. A host bridge 20 couples the host bus 14 to an I/O bus 22 (e.g., a Peripheral Component Interconnect (PCI) bus). One or more input devices 24 couple to the I/O bus 22. Similarly, one or more output devices 26 couple to the I/O bus 22.

The processor 12 communicates with the memory device 18 through the memory controller 16. The memory controller 16 provides memory addresses and logic signals to the memory device 18 to characterize the desired memory transactions. In the illustrated embodiment, the memory device 18 is a synchronous memory device such as a Synchronous Dynamic Random Access Memory (SDRAM). Although the present invention is described in reference to an SDRAM, its application is not so limited. In light of the disclosure herein, the present invention may be adapted for use with other types of memory devices (not shown).

Figure 2:
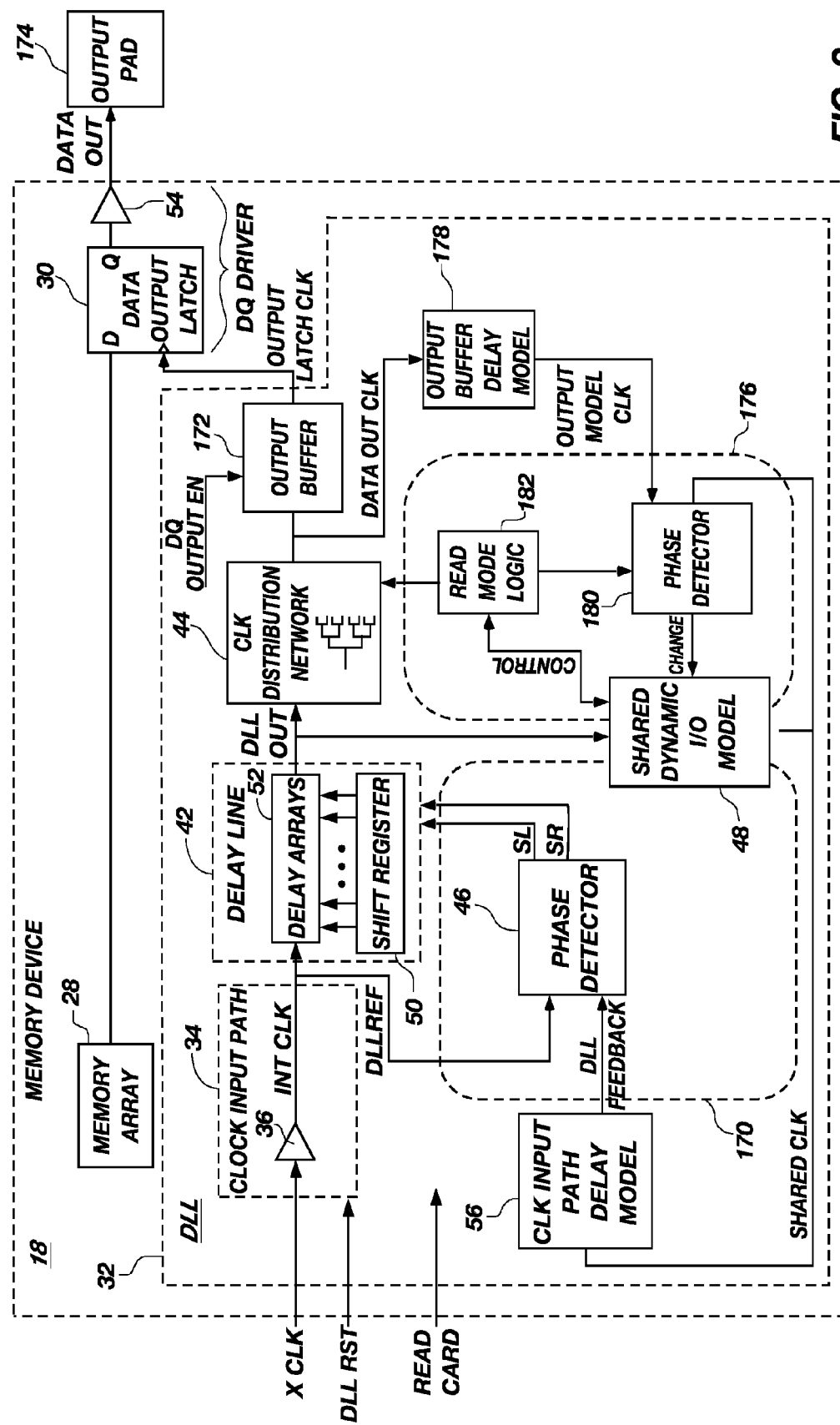
FIG. 2 is a block diagram of a memory device including a dual-loop DLL, in accordance with an embodiment of the present invention.
Figure 4:
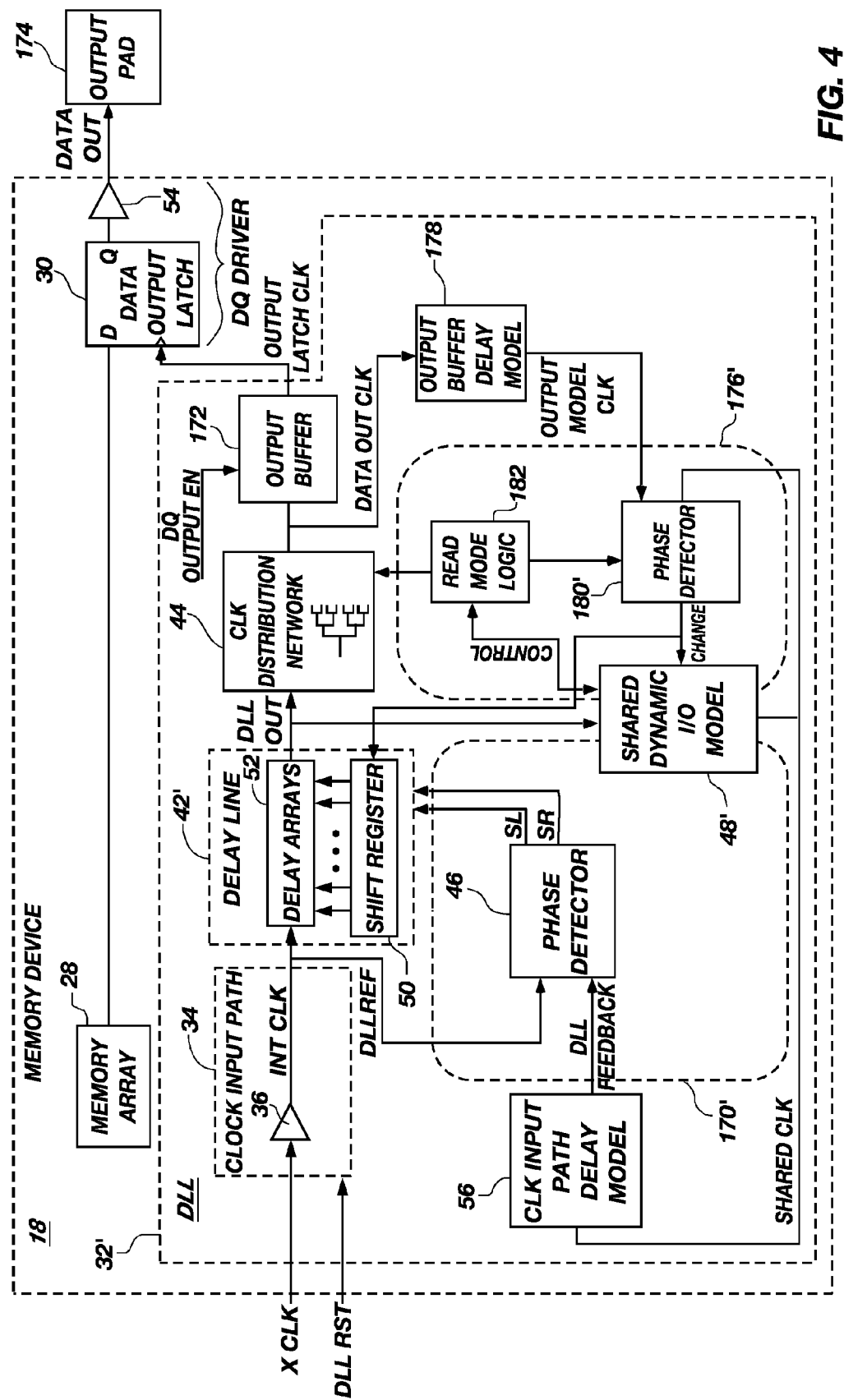
FIG. 4 is a block diagram of a memory device including a dual-loop DLL, in accordance with another embodiment of the present invention.
Figure 5:
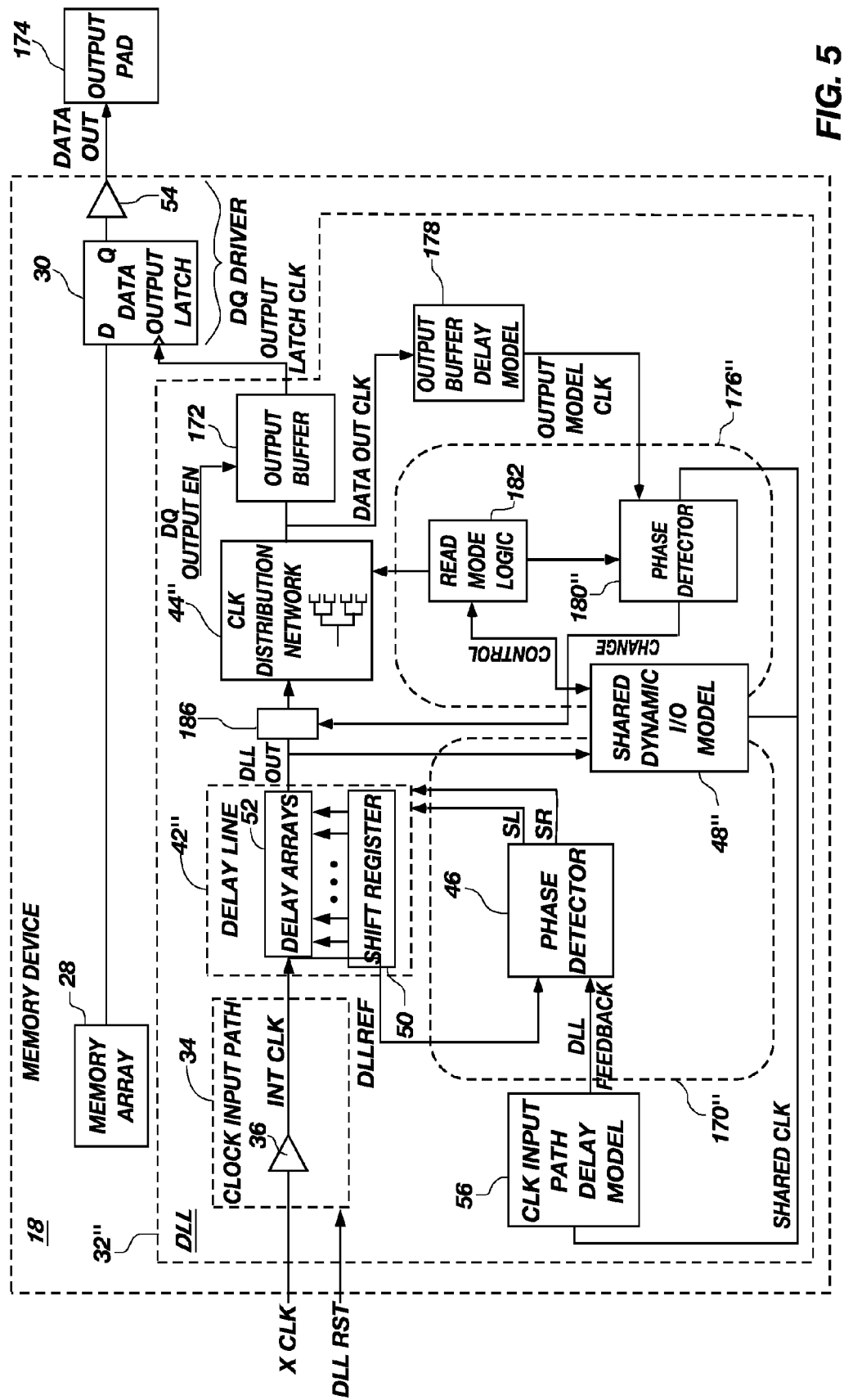
FIG. 5 is a block diagram of a memory device including a dual-loop DLL, in accordance with yet another embodiment of the present invention.

FIG. 2, FIG. 4, and FIG. 5 illustrate simplified block diagrams of various embodiments of a memory device 18 including various embodiments of a dual-loop DLL. The various embodiments of FIG. 2, FIG. 4, and FIG. 5 illustrate various interconnection and feedback configurations for an adaptive dual-loop DLL of a synchronous circuit, such as a memory device.

Referring to the embodiment of FIG. 2, memory device 18 includes a memory array (sometimes also referred to as "memory core") 28 for storing addressable data therein.

Memory array 28 may further include buffers (sometimes referred to as "pipelines") for staging the delivery of data to a data output latch 30. Pipelining elements are representative of the characteristic delay of the device, which is consistent with synchronous memory technologies. Staging or pipelining of data in synchronous memories is understood by those of ordinary skill in the art and is, therefore, not further described herein.

The memory device 18 further includes a dual-loop DLL 32 implemented to predict or match the loop delay of a clock signal in memory device 18 and to generate a clock signal OUTPUT LATCH CLK to the data output latch 30 that is desirably aligned to the external clock signal XCLK to within an acceptable $t_{AC}$ variance. According to the various embodiments discussed herein, DLL 32 is configured as a dual-loop DLL comprising a main loop 170 and a secondary loop 176.

Generally, the main loop 170 compares a clock signal prior to a delay line with a signal occurring after the delay line and may be considered to be dynamic and dependent over that portion of the circuit. The secondary loop 176 adaptively fine tunes a shared dynamic I/O model during operation by sensing the phase difference between an output of the shared dynamic I/O model and an output clock signal occurring much closer to the actual output of the DLL. The secondary loop 176 then generates a change in the shared dynamic I/O model (which is sometimes referred to as a "shared replica") through which the main loop 170 generates changes to the clock delay through the delay line. Accordingly, the shared dynamic I/O model may be adjusted due to any actual resulting mismatch of the clock signal near the data output latch as compared with a main loop only comparison of an internal shared clock signal. Utilization of a secondary loop should better approximate the actual delay associated with the various input and output circuits as affected by the existing PVT conditions at the memory device 18.

Specifically, DLL 32 includes a clock input path 34 for receiving an external clock signal XCLK. The external clock signal XCLK may originate from a memory controller 16 (FIG. 1) or may be generated independently by a clock generator (not shown) of electronic system 10 (FIG. 1). The external clock signal XCLK may be implemented as a single-ended signal or as differential signals, XCLK and XCLKF (not shown). The external clock signal XCLK couples to an input of a clock buffer 36. The main loop 170 of DLL 32 further includes delay models, one of which is illustrated as a clock input path delay model 56 for modeling the driver delay associated with the clock buffer 36 of the clock input path 34.

DLL 32 further includes a delay line 42 configured to receive a signal DLLREF from the output of clock buffer 36 of the clock input path 34 and to generate a delay line output signal DLLOUT. The delay line 42 is configured to make adjustments to the loop delay by inserting or bypassing propagation delay elements within delay line 42 resulting in the insertion or deletion of delay through DLL 32.

Delay line 42 operates in conjunction with a phase detector 46, which generates outputs (e.g., shift left SL, shift right SR) based upon the difference of the input signals. When the difference between the input signals at phase detector 46 varies, phase detector 46 provides adjustments destined for delay line 42 in an attempt to arrive at a zero-phase differential between both of the input signals presented at the inputs of phase detector 46. Delay line 42 may be implemented in various embodiments as a digital DLL that includes a shift register 50 which, in the illustrated embodiments, is implemented such that the location of a bit within the shift register 50 indicates the location for the coupling of the reference signal DLLREF, resulting in a determination of the amount of delay inserted by delay line 42. Accordingly, the shift register 50 is responsive to a SHIFT LEFT (SL) signal, and a SHIFT RIGHT (SR) signal.

Delay line 42 further includes one or more delay arrays 52 that correspond to the implementation of one or more delay lines or paths within delay line 42. Delay line 42 may be implemented as a Synchronous Mirror Delay (SMD)-type or, alternatively, may be implemented as multiple independent delay lines within delay line 42. Additional implementations of delay lines are also contemplated within the scope of the present invention. For example, in addition to independent multiple delay lines and SMD-type delays, other more traditional implementations including NAND delays and analog delay elements are also contemplated.

Memory device 18 further includes a shared dynamic I/O model 48, which couples the delay line output signal DLLOUT with the phase detector 46 of DLL 32 via clock input path delay model 56. Shared dynamic I/O model 48 is placed in the feedback path of the main loop 170 to provide an approximation of actual delays that occur in the output data path between the internal clock signal INTCLK and the data output latch clocking signal OUTPUTLATCHCLK.

As stated, conventional DLLs operate at a sufficiently slow clocking frequency that process-voltage-temperature (PVT) variations to the $t_{AC}$ (i.e., the time from when a transition occurs on the XCLK to the time when the data comes through the synchronizing data output latch) were essentially insignificant or adequately compensated for by a replica in the form of an I/O model. However, as clock frequency has increased, the process-voltage-temperature (PVT) variations are significant resulting in an unacceptable $t_{Ac}$ variance.

Accordingly, memory device 18 further includes secondary loop 176 for providing additional delay adjustments to further align the external clock signal XCLK with the DLL-generated OUTPUTLATCHCLK clock signal. The secondary loop 176 includes a clock distribution network 44 coupled to DLL 32 by way of a DLL output signal DLLOUT. Clock distribution network 44 facilitates a uniform distribution or fanout to each of the outputs located within a specific memory device. One such specific output from clock distribution network 44 is illustrated as DATAOUTCLK, which is input into an output buffer 172 to generate clock signal OUTPUTLATCHCLK for latching or strobing the data output latch 30. Clock distribution network 44 and output buffer 172 form an output path from delay line 42. Data output latch 30 couples to memory array 28 and generates an output signal that further couples to a driver 54, forming a DQ DRIVER. An output DATA OUT of driver 54 couples to an output pad 174.

The secondary loop 176 of DLL 32 further includes delay models, one of which is illustrated as an output buffer delay model 178 for modeling the output driver delay associated with output buffer 172. Output buffer delay model 178 couples to a phase detector 180 that generates outputs based upon the difference between the input signals. Phase detector 180 provides signals for adjustments to the shared dynamic I/O model 48 in an attempt to arrive at a zero-phase differential between the input signals presented at the inputs of phase detector 180. Phase detector 180 receives a clock signal OUTPUTMODELCLK from output buffer delay model 178 that provides a feedback signal at a point much closer to the actual output of the DLL 32 than is available with conventional DLL architectures. The clock signal SHAREDCLK is compared to the clock signal OUTPUTMODELCLK for generating adjustments to the shared dynamic I/O model 48.

Control logic for periodically updating the comparison results from phase detector 180 is illustrated as read mode logic 182. Read mode logic 182 may periodically update the control signals from phase detector 180 or, alternatively, may disable the secondary loop 176 to allow for conventional DLL operation according to a single loop configuration. An update of the secondary loop 176 may also be performed when a determination is made that the $t_{Ac}$ variation between an input clock and the output clock have exceeded the specification. Furthermore, a training sequence may also initialize the secondary loop 176 prior to execution of a read command to enable the secondary loop 176.

Figure 3:
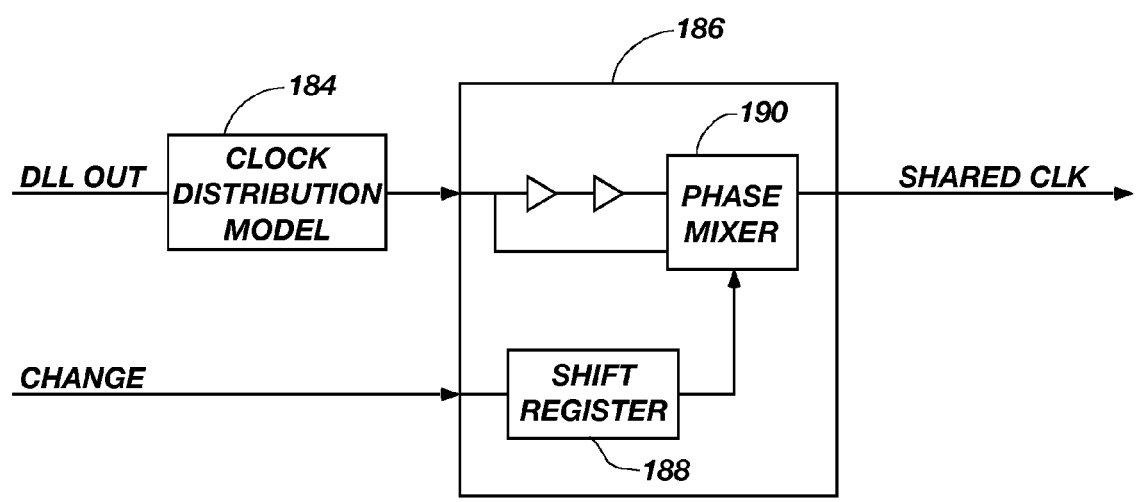
FIG. 3 is a block diagram of a shared I/O model or replica, in accordance with an embodiment of the present invention.

FIG. 3 illustrates a shared dynamic I/O model, in accordance with one or more embodiments of the present invention. A shared dynamic I/O model 48 may be implemented according to various configurations. In one embodiment, the shared dynamic I/O model 48 is configured to include a clock distribution model 184, which forms a model of the delay through clock distribution network 44 of FIG. 2. The shared dynamic I/O model 48 further includes a fine delay line 186 configured to be responsive to one or more CHANGE signals from the phase detector 180 of FIG. 2. The CHANGE signal causes a shift register 188 to adjust a phase mixer 190.

In one embodiment of the present invention, the phase mixer 190 digitizes the delay interval between two incoming edge-triggered signals based on the values in the shift register (e.g., 0-7) to determine the weight or percentage of each signal to be mixed such as one signal from 0% to 100% and the other signal from 100% to 0% followed by the combination of the signals together to generate a final signal. Specifically, one signal may be a two-gate delayed version of the other as illustrated in FIG. 3 resulting in a smaller fine delay step, for example, of roughly 20-40 picoseconds for the fine delay line 186. Regarding resolution, the $t_{AC}$ adjustment capability is dependent upon the granularity of the fine delay line 186. Specifically, the smaller the steps, the finer tuning of the $t_{AC}$ variance. However, the additional granularity results in an increased lock time for the DLL since each of the smaller steps are traversed.

FIG. 4 illustrates a block diagram of a dual-loop DLL, in accordance with another embodiment of the present invention. For clarity, only the DLL elements and interconnections that vary from the previously described embodiment of FIG. 2 are elaborated upon herein. A DLL 32' also includes an output signal CHANGE from a phase detector 180' that provides direct feedback from the secondary loop 176' to the delay line 42' of the main loop 170'. Additionally, the shared dynamic I/O model 48' adapts based upon determinations in the secondary loop 176' as designated by the output signal CHANGE. The present embodiment results in an improved response time by directly modifying the delay line 42' without awaiting a traversal of the clock signal SHAREDCLK around the main loop 170'.

FIG. 5 illustrates a block diagram of a dual-loop DLL, in accordance with yet another embodiment of the present invention. For clarity, only the DLL elements and interconnections that vary from the previously described embodiment of FIG. 2 are elaborated upon herein. A DLL 32" relocates the fine delay line 186 of FIG. 3 from the shared dynamic I/O model 48" to be inline with the clock signal between delay line 42" and clock distribution network 44". The fine delay line 186 is controlled by the output signal CHANGE from a phase detector 180". Accordingly, the shared dynamic I/O model 48" is not modified by the secondary loop 176". Furthermore, placement of the fine delay line 186 in the direct clock path can allow improved resolution over placement of the fine delay line 186 in a feedback path.

Figure 6:
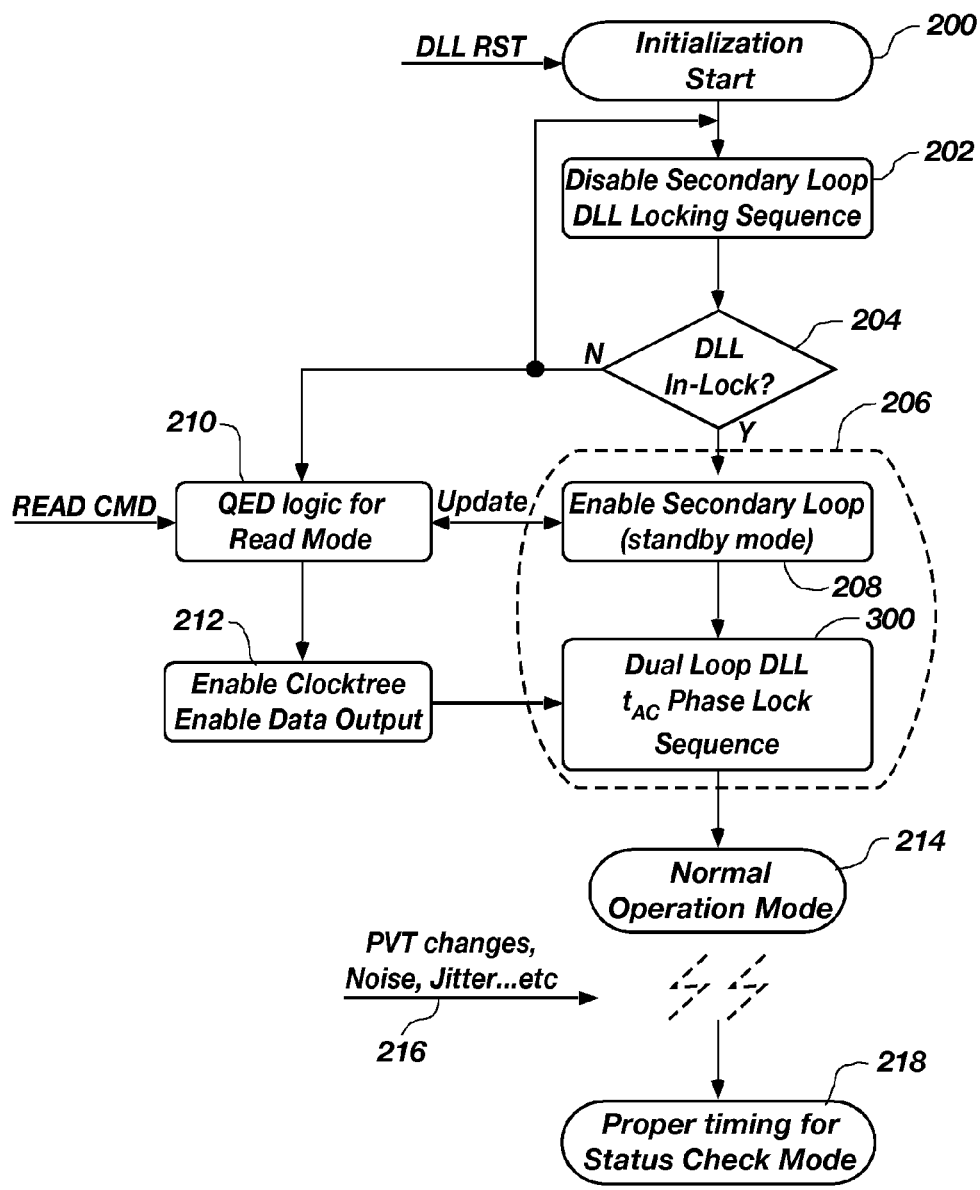
FIG. 6 and FIG. 7 are flow diagrams of a locking sequence for a dual-loop DLL, in accordance with one or more embodiments of the present invention.
Figure 7:
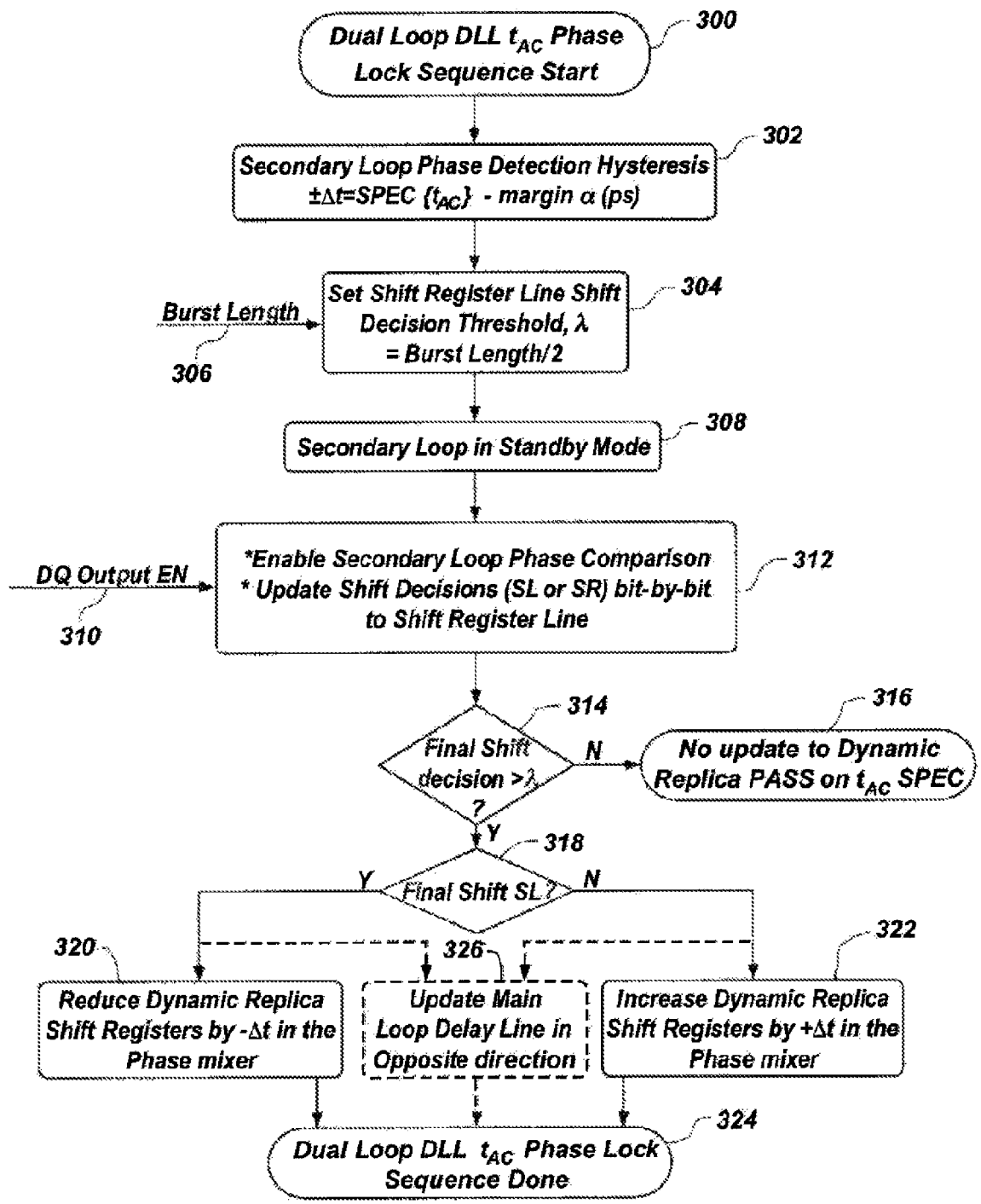

FIG. 6 and FIG. 7 are flow diagrams illustrating the operational flow of the dual-loop DLL, in accordance with an embodiment of the present invention. DLL 32 is initialized 200 to determine the loop delay of a clock signal within memory device 18 and for providing the clock signal OUTPUTLATCHCLK to the data output latch 30 aligned within an acceptable $t_{AC}$ variance with the external clock signal XCLK. The secondary loop 176 is disabled 202 in order to allow the main loop 170, including the delay line 42, to determine an approximation of the delay without the secondary loop 176 introducing dynamics into the shared dynamic I/O model 48.

A determination 204 results in either the main loop 170 being determined as being locked 206 or returning for iterative convergence toward a locked state while the secondary loop 176 remains disabled 202. When the main loop 170 is locked 206, the secondary loop 176 is enabled 208 and phase locking of the dual-loop DLL occurs according to sequence 300 as detailed below with respect to FIG. 7. A read command READCMD activates 210 read mode logic 182 and allows updating of the secondary loop 176 and further enables 212 the clock distribution network 44 and the output enable signal DQOUTPUTEN. When the dual-loop DLL is locked, normal operation mode 214 occurs until either external conditions 216, such as process-voltage-temperature (PVT) variations, noise, jitter, etc., cause an out-of-specification $t_{AC}$ variation or a periodic timed update occurs causing the delay to be checked 218.

FIG. 7 details the sequence 300 for phase locking the dual-loop DLL 32. The hysteresis of the secondary loop 176 is defined 302 according to the specification for $t_{AC}$ and a defined margin of operation. By way of example and not limitation, a delay shift decision threshold, $\lambda$, for the fine delay line 186 is defined 304 to equal, for example, half of a burst length 306. It should be appreciated that the smaller the delay decision threshold, $\lambda$, the more sensitive the secondary loop updates become to $t_{AC}$ as the bits fall out of the specification per burst length.

The secondary loop 176 is held 308 in standby mode until an output enable signal DQOUTPUTEN 310 enables 312 the secondary loop 176 for phase comparison and updating of shifting of the delay in the shift register 188 of the fine delay line 186. When a final shift at shift register 188 is determined 314 to be less than the shift decision threshold, $\lambda$, then the phase detector 180 does not generate a CHANGE signal and the shared dynamic I/O model 48 remains unchanged 316.

When a final shift in shift register 188 is determined 314 to be greater than the shift decision threshold, $\lambda$, then a determination 318 identifies the need for an adjustment, for example a shift left, a reduction 320 of $-\Delta t$ in the phase mixer 190 of the shared dynamic I/O model 48 is performed. When a determination 318 identifies the need for an opposite adjustment, for example a shift right, an increase 322 of $+\Delta t$ in the phase mixer 190 of the shared dynamic I/O model 48 is performed. Accordingly, the dual-loop DLL 32 is then phase locked 324. Alternatively, the main loop 170 may be updated 326 as described above with reference to FIG. 4 in response to determination 318 of shift decisions in the secondary loop 176.

CONCLUSION

A circuit, delay-locked loop, memory device, system and method of synchronizing a clock is disclosed. A circuit generally includes a delay line configured to delay an external clock signal to produce a substantially in-phase output clock signal, a main loop configured to control delay through the delay line, and a secondary loop configured to adjust delay through the main loop. The circuit specifically includes a delay line configured to delay an internal clock signal derived from an external clock signal to produce an output clock signal substantially in phase with the external clock signal. The circuit further includes a shared dynamic I/O model configured to model an output path delay through the circuit and from which control of the delay in the delay line is adjusted and a secondary loop configured to compare the output clock signal and adjust the shared dynamic I/O model in response thereto.

A delay-locked loop circuit includes a delay line having first and second inputs and an output with the first input configured to receive an external clock signal via a clock input path and the output configured to couple with an output buffer. The delay-locked loop circuit further includes a shared dynamic I/O model having an output and first and second inputs with the first input configured to couple with the output of the delay line. A first phase detector includes forward and feedback path inputs and an output with the forward path input coupled to the first input of the delay line and the feedback path input coupled to the output of the shared dynamic I/O model and the output coupled to the second input of the delay line for adjusting the delay therethrough. Additionally, a second phase detector includes forward and feedback path inputs and an output with the forward path input coupled to the output buffer and the feedback path input coupled to the output of the shared dynamic I/O model and the output of the second phase detector coupled to the second input of the shared dynamic I/O model to adjust the modeled delay.

A memory device includes a memory array with an output driver coupled thereto and a delay-locked loop operably coupled between the output driver and an external clock signal. The delay-locked loop includes a delay line configured to delay an external clock signal to produce an output clock signal, a main loop configured to control delay through the delay line, and a secondary loop configured to adjust delay through the main loop.

A clock synchronization method generally includes adjusting a delay along a delay line in response to a first phase difference between an input clock to the delay line and a shared clock signal delayed by a shared dynamic I/O model of an output driver. The method further includes adjusting the shared dynamic I/O model in response to a second phase difference between an output clock signal and the shared clock signal. Specifically, the clock synchronization method includes inputting an external clock signal into a forward loop path including a delay line and detecting a first phase difference between a forward loop path delay and a feedback loop path delay with the forward loop path being adjusted in response to the first phase difference. A second phase difference is detected between an output clock and the feedback loop path delay. The feedback loop delay is adjusted in response to the second phase difference and an output clock is generated at an output of the forward loop path.

Although the foregoing description contains many specifics, these should not be construed as limiting the scope of the present invention, but merely as providing illustrations of some exemplary embodiments. Features from different embodiments may be employed in combination. All additions, deletions, and modifications to the invention, as disclosed herein, which fall within the meaning and scope of the claims are to be embraced thereby.

What is claimed is:

1. A circuit, comprising:
  a delay line including an input coupled to an external clock signal and generating an output clock signal;
  a shared dynamic model configured to model an output path delay through the circuit, and from which the delay line is adjusted, wherein the shared dynamic model is adjustable; and
  a secondary loop configured to compare the output clock signal and adjust the shared dynamic model in response thereto.

2. The circuit of claim 1, further comprising a first phase detector for comparing a shared clock signal from the shared dynamic model with the external clock signal and controlling the delay line.

3. The circuit of claim 2, wherein the secondary loop comprises a second phase detector configured to compare the output clock signal and the shared clock signal and adjust the shared dynamic model in response thereto.

4. A delay-locked loop, comprising:
  a delay line generating a substantially in-phase output clock signal;
  a main loop including a feedback path through a shared dynamic output model configured to approximate the delay of output circuits through which the output clock signal traverses and to compare a feedback signal from the shared dynamic output model with an external clock signal, and to adjust the delay line in response thereto; and a secondary loop including a second phase detector configured to compare the feedback path through the shared dynamic output model with the output clock signal and to adjust the shared dynamic output model in response thereto.

5. The delay-locked loop of claim 4, further comprising a clock distribution network coupled between an output of the delay line and the output clock signal, the shared dynamic output model further configured to model the delay through the clock distribution network.

6. The delay-locked loop of claim 4, further comprising logic configured to enable the secondary loop for adjusting a delay through the shared dynamic output model.

7. The delay-locked loop of claim 6, wherein the logic is responsive to one of a read command, a phase variance determination and a periodic determination for adjusting the shared dynamic output model.

8. A delay-locked loop circuit, comprising:
a delay line having a clock input path and an output configured to couple with an output buffer;
a shared dynamic output model configured to couple with the output of the delay line to model delay of the output buffer, wherein the shared dynamic model is adjustable;
a first phase detector having a first input coupled to a first input of the delay line and a second input coupled to an output of the shared dynamic output model and to a second input of the delay line; and
a second phase detector having forward and feedback path inputs and an output, the forward path input coupled to the output buffer and the feedback path input coupled to the output of the shared dynamic output model, the output of the second phase detector coupled to the second input of the shared dynamic output model to adjust the modeled delay.

9. The delay-locked loop circuit of claim 8, further comprising logic configured to enable the second phase detector for adjusting the shared dynamic output model.

10. The delay-locked loop circuit of claim 9, wherein the logic is responsive to one of a read command, a phase variance determination or a periodic determination for adjusting the shared dynamic output model.

11. A clock synchronization method, comprising:
adjusting a delay line in response to a shared clock signal delayed by a shared dynamic output model of an output driver, wherein the shared dynamic model is adjustable; and
adjusting the shared dynamic output model in response to a phase difference between an output clock signal and the shared clock signal.

12. The method of claim 11, wherein the adjusting the shared dynamic output model further comprises:
adjusting the shared dynamic output model in response to one of a read command, a phase variance determination or a periodic determination for adjusting the shared dynamic output model; and
retaining the shared dynamic output model in an adjusted state.

13. The method of claim 11, further comprising updating the second phase difference in response to one of a read command, a phase variance determination or a periodic determination for adjusting the shared dynamic output model.

14. A method, comprising:
delaying a clock signal derived from an external clock signal to produce an output clock signal substantially in phase with the external clock signal;
dynamically modeling an output path delay through a circuit, and from which a delay is adjusted; and
comparing the output clock signal and adjusting a shared dynamic model in response thereto.

15. The method of claim 14, further comprising comparing a shared clock signal from the shared dynamic model with the clock signal and generating a control of the delay in a delay line.

16. The method of claim 15, wherein the comparing comprises comparing the output clock signal and the shared clock signal and adjusting the shared dynamic model in response thereto.

* * * * *

UNITED STATES PATENT AND TRADEMARK OFFICE
CERTIFICATE OF CORRECTION

PATENT NO.        : 8,115,528 B2                                       Page 1 of 1
APPLICATION NO.   : 12/763941
DATED             : February 14, 2012
INVENTOR(S)       : Yantao Ma It is certified that error appears in the above-identified patent and that said Letters Patent is hereby corrected as shown below:

In column 1, line 9, delete "11,756,413," and insert -- 11/756,413, --, therefor.

In column 1, line 10, delete "7,701,272" and insert -- 7,701,272, --, therefor.

Signed and Sealed this
Seventeenth Day of April, 2012

David J. Kappos
*Director of the United States Patent and Trademark Office*